(12) United States Patent
Ohishi

(10) Patent No.: US 7,084,534 B2
(45) Date of Patent: Aug. 1, 2006

(54) ALIGNMENT STAGE APPARATUS

(75) Inventor: Shinji Ohishi, Oyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/030,952

(22) Filed: Jan. 10, 2005

(65) Prior Publication Data
US 2005/0093378 A1  May 5, 2005

(30) Foreign Application Priority Data
Jan. 26, 2004  (JP)  .............................. 2004-016857

(51) Int. Cl.
*H02K 41/00* (2006.01)
*H01L 21/68* (2006.01)

(52) U.S. Cl. .......................... 310/12; 310/17; 318/135

(58) Field of Classification Search ................. 310/12, 310/17; 336/118; 318/135; 191/2, 10
See application file for complete search history.

(56) References Cited

U.S. PATENT DOCUMENTS

| | | | |
|---|---|---|---|
| 4,810,941 A | 3/1989 | Ohishi et al. ............... 318/314 |
| 4,836,344 A * | 6/1989 | Bolger ......................... 191/10 |
| 5,184,055 A | 2/1993 | Ohishi et al. ............... 318/615 |
| 5,260,580 A | 11/1993 | Itoh et al. ................. 250/492.2 |
| 5,293,308 A * | 3/1994 | Boys et al. ..................... 363/37 |
| 5,469,036 A * | 11/1995 | Eto ............................. 318/581 |
| 5,542,356 A * | 8/1996 | Richert et al. .............. 104/289 |
| 5,666,038 A | 9/1997 | Ohishi ......................... 318/625 |
| 5,737,211 A * | 4/1998 | Hirai et al. .................. 363/144 |
| 5,821,728 A * | 10/1998 | Schwind ...................... 320/108 |
| 5,994,798 A * | 11/1999 | Chitayat ....................... 310/12 |
| 6,089,512 A * | 7/2000 | Ansorge et al. ............. 246/194 |
| 6,175,124 B1 * | 1/2001 | Cole et al. ..................... 257/48 |
| 6,307,766 B1 * | 10/2001 | Ross et al. .................. 363/144 |
| 6,408,045 B1 | 6/2002 | Matsui et al. ................. 378/34 |
| 6,515,878 B1 * | 2/2003 | Meins et al. ................... 363/37 |
| 6,580,185 B1 * | 6/2003 | Kang et al. .................. 310/12 |
| 6,590,633 B1 | 7/2003 | Nishi et al. ................... 355/53 |
| 6,931,304 B1 * | 8/2005 | Miller et al. ................. 700/245 |
| 2003/0164934 A1 | 9/2003 | Nishi et al. ................... 355/72 |
| 2005/0052143 A1 | 3/2005 | Ohishi ......................... 318/135 |
| 2005/0073668 A1 | 4/2005 | Ohishi .......................... 355/72 |

FOREIGN PATENT DOCUMENTS

| | | |
|---|---|---|
| JP | 03-007002 A * | 1/1991 |
| JP | 8-51137 | 2/1996 |
| JP | 10-270535 | 10/1998 |
| WO | 94-10003 A1 * | 5/1994 |

* cited by examiner

*Primary Examiner*—Burton Mullins
(74) *Attorney, Agent, or Firm*—Fitzpatrick, Cella, Harper & Scinto

(57) ABSTRACT

An alignment stage apparatus including a base structure and a movable stage, which can move along a surface of the base structure so as not to be in contact with the base structure. The apparatus includes a plurality of power transmission coils buried under the surface of the base structure, a power reception coil attached to the movable stage to oppose the surface, a switch unit configured to sequentially switch, of the plurality of power transmission coils, those that are to be energized to feed power in accordance with a position of the movable stage, and a power feed unit configured to supply AC power to the power transmission coils to be energized through the switch unit. The power reception coil includes a plurality of power reception coils arrayed in a driving direction of the movable stage, and the power reception coils and power transmission coils are phase-shifted from each other by 180°/n where n is the number of power reception coils arrayed in the driving direction of the movable stage.

2 Claims, 11 Drawing Sheets

ALIGNMENT STAGE APPARATUS

FIELD OF THE INVENTION

The present invention relates to an alignment stage apparatus used in a device manufacturing apparatus, or the like, which manufactures a device having a fine pattern, e.g., a semiconductor device.

BACKGROUND OF THE INVENTION

Japanese Patent Laid-Open No. 10-270535 shows the structure of an alignment stage apparatus in a semiconductor exposure apparatus. FIG. 7 is a plan view of the alignment stage apparatus described in Japanese Patent Laid-Open No. 10-270535, and FIG. 8 is a side view of the same.

In the conventional alignment stage apparatus as shown in FIG. 7, coils 102 are arranged like a matrix in a base structure 101, and permanent magnets 112 are similarly arranged like a matrix under a movable stage main body 103. When a current is supplied to the driving coils 102 opposing the permanent magnets 112, the movable stage main body 103 receives a thrust by the Lorentz force and is driven.

An electrostatic chuck 106, which holds a wafer by the electrostatic force, and various types of sensors 104, e.g., a sensor for monitoring the light quantity of a light source and an alignment sensor, are arranged on the movable stage main body 103.

Bearings 107 for supporting the weight of the stage are arranged on the lower surface of the movable stage main body 103. The movable stage main body 103 is guided while sliding on the surface of the base structure 101 whose flatness is compensated for. Alternatively, the weight of the movable stage main body 103 can be supported by the Lorentz force. In this case, magnets are arranged on the lower surfaces of the bearings as well.

Two bar mirrors 105 are arranged on the movable stage main body 103 to be perpendicular to each other. A laser interferometer 108 mounted on an interferometer support 113 measures the position of the movable stage main body 103. A current is supplied to the driving coils 102 to align the movable stage main body 103 such that the measured position of the movable stage main body 103 coincides with a target value from a control device.

In the conventional stage structure shown in FIGS. 7 and 8, power feeding means 110 and power receiving means 109 are provided for supplying power to the electrostatic chuck 106, sensor 104, and the like, on the movable stage main body 103. The received power is stored in a rechargeable battery 111. As the power feeding means, for example, a method of mechanically bringing an electrical contact into contact, and a method of opposing electromagnetic cores 114 to each other to form a magnetic circuit and supplying power in a non-contact manner by electromagnetic induction, as shown in Japanese Patent Laid-Open No. 8-51137, are available.

FIG. 9 shows the schematic structure of the method of supplying power by electromagnetic induction. When an AC power supply 127 of several kHz to several tens of kHz is connected to the transmission side electromagnetic core, power is supplied to the reception side electromagnetic core by electromagnetic induction. The supplied power charges the battery 111.

In the conventional structure described above, when a movable stage returns to a wafer transfer position to transfer a wafer, the power feeding means and power receiving means oppose each other to charge the battery. In an exposure operation, or the like, during which the movable stage separates from the wafer transfer position, the power for the electrostatic chuck and sensors is supplied from the battery 111. After the exposure is complete, when the movable stage returns to the wafer transfer position again, the battery 111 is charged again.

According to Japanese Patent Laid-Open No. 8-51137, in a transport apparatus, which electrically chucks and transports a silicon wafer, a means for supplying power by electromagnetic induction is provided at each stop position along the transport path, so that the electrostatic chucking means is charged (for chucking) or discharged (for release). Although a capacitor for keeping the voltage is mounted, since power consumption for electrostatic chucking is very small, no battery is mounted.

In the conventional example described in Japanese Patent Laid-Open No. 10-270535, the power feeding means and power receiving means are provided for supplying power to the electrostatic chuck and sensors on the movable stage main body, as shown in FIG. 7. The received power is stored in the rechargeable battery. Therefore, power can be supplied only when the stage is located at a certain predetermined position, such as a wafer transfer position.

With this structure, since the power can only be supplied at a specific position, such as the wafer transfer position, the stage main body must be returned, when necessary, to a position where power can be supplied, to charge the battery. This prolongs the process interval of exposure, or the like, or interrupts the process, to accordingly decrease the throughout. The battery is charged after it is discharged to a certain degree, and it takes time to charge the battery. The alignment apparatus cannot start the next operation until charging is complete. This is disadvantageous in terms of throughput.

Also, in the conventional example described in Japanese Patent Laid-Open No. 8-81137, power can only be supplied at a specific position, such as a stop position, and, accordingly, cannot be supplied at an arbitrary position or timing. If a battery must be mounted on the movable stage from the viewpoint of power consumption in the movable stage, the same problems as those of the conventional example described in Japanese Patent Laid-Open No. 10-270535 arise.

Alternatively, no battery will be used and power may be supplied through an electrical cable. In this case, however, the accuracy of the movable stage is degraded by the disturbance of the cable. With a stage apparatus having a flat structure, it is difficult to arrange and package the cable. If the cable is rubbed, dust may be produced to attach to the wafer. If the jacket of the cable degrades, trouble, such as insufficient insulation or wire disconnection, may occur.

SUMMARY OF THE INVENTION

The present invention has been made in view of the unsolved problems of the prior art described above, and has as its object to provide an alignment stage apparatus in which power can be supplied in a non-contact manner at an arbitrary position or timing without using any electrical cable, particularly, an alignment stage apparatus suitable as a stage apparatus having a flat structure.

In order to achieve the above object, an alignment stage apparatus according to the present invention, including a base structure and a movable stage, which can move along a surface of the structure so as not to be in contact with the base structure, comprises a plurality of power transmission coils buried under the surface of the base structure, a power reception coil attached to the movable stage to oppose the surface, switching means for sequentially switching, of the plurality of power transmission coils, those that are to be energized to feed power in accordance with a position of the movable stage, and power feeding means for supplying AC power to the power transmission coils to be energized through the switching means.

In a preferred embodiment of the present invention, at least some of the plurality of power transmission coils are also used as driving coils, which move the movable stage. The power reception coil comprises a plurality of power reception coils arrayed in a driving direction of the movable stage. In this case, the power reception coils are preferably arranged to be phase-shifted from the power transmission coils. To arrange the power reception coils to be phase-shifted is to set the gap among the power reception coils to be different from the pitch of the power transmission coils and an integer multiple of the pitch.

More specifically, the power reception coils and power transmission coils are phase-shifted from each other by 180°/n where n is the number of power reception coils arrayed in the driving direction of the movable stage. Namely, the gap among the power reception coils is set to (K±½n) (where K is an integer of 1 or more and can change between adjacent pairs of power reception coils) times the pitch of the power transmission coils. In this case, when one power reception coil opposes one power transmission coil, the remaining power reception coils oppose no power transmission coils. When outputs from the plurality of power reception coils are to be rectified, an output obtained when connecting the power transmission coils in series may be input to a rectifying circuit. Alternatively, outputs from the respective power reception coils may be input to the rectifying circuit and rectified separately, and synthesized.

If the frequency of the AC power is set at a resonance frequency determined by load and mutual inductance between the power transmission coils and power reception coils, power transmission can be performed more efficiently.

Power is transmitted and received by superposing a control signal on the AC power, so that an electrical circuit on the movable stage and a control device provided to the base structure can communicate with each other.

A rechargeable secondary battery may be mounted on the movable stage together with or in place of a smoothing capacitor for a DC circuit.

The present invention can be applied when the driving direction of the movable stage comprises either a one- or two-dimensional direction along the surface of the base structure.

According to the present invention, the plurality of power transmission coils to be electromagnetically coupled to the power reception coils attached to the movable stage are buried in the base structure. The power transmission coils are switched in accordance with the position of a movable stage. Therefore, power can be supplied from the base structure to the electrical circuit on the movable stage at an arbitrary position or timing. When a battery is mounted on the movable stage main body, as the battery can be floating-charged, the stage need not be returned to a specific position for charging. A process, such as exposure, need not be interrupted. Charging does not take time. A high throughput can be achieved by using the alignment stage apparatus.

A large battery need not be mounted on the movable stage and the stage can accordingly be made lightweight. Therefore, the speed of the movable stage can be increased, so that a high throughput can be achieved.

The present invention can be applied to a case wherein no battery is mounted. In this case, maintenance, such as periodic battery exchange, becomes unnecessary, and a decrease in operating efficiency of the apparatus can be prevented.

Since power can be fed in a complete non-contact manner, power feed through an electrical cable is not necessary. The alignment accuracy will not accordingly be degraded by a cable packaging disturbance, or the like. Since no cable is used, trouble, such as dust being produced when the cable is rubbed to attach to the wafer, insufficient insulation or wire disconnection due to the degrading of the jacket of the cable, and the like, are eliminated.

The alignment stage apparatus of the present invention is particularly suitable as a stage apparatus having a flat structure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The embodiments of the present invention will be described.

First Embodiment

Figure 1:
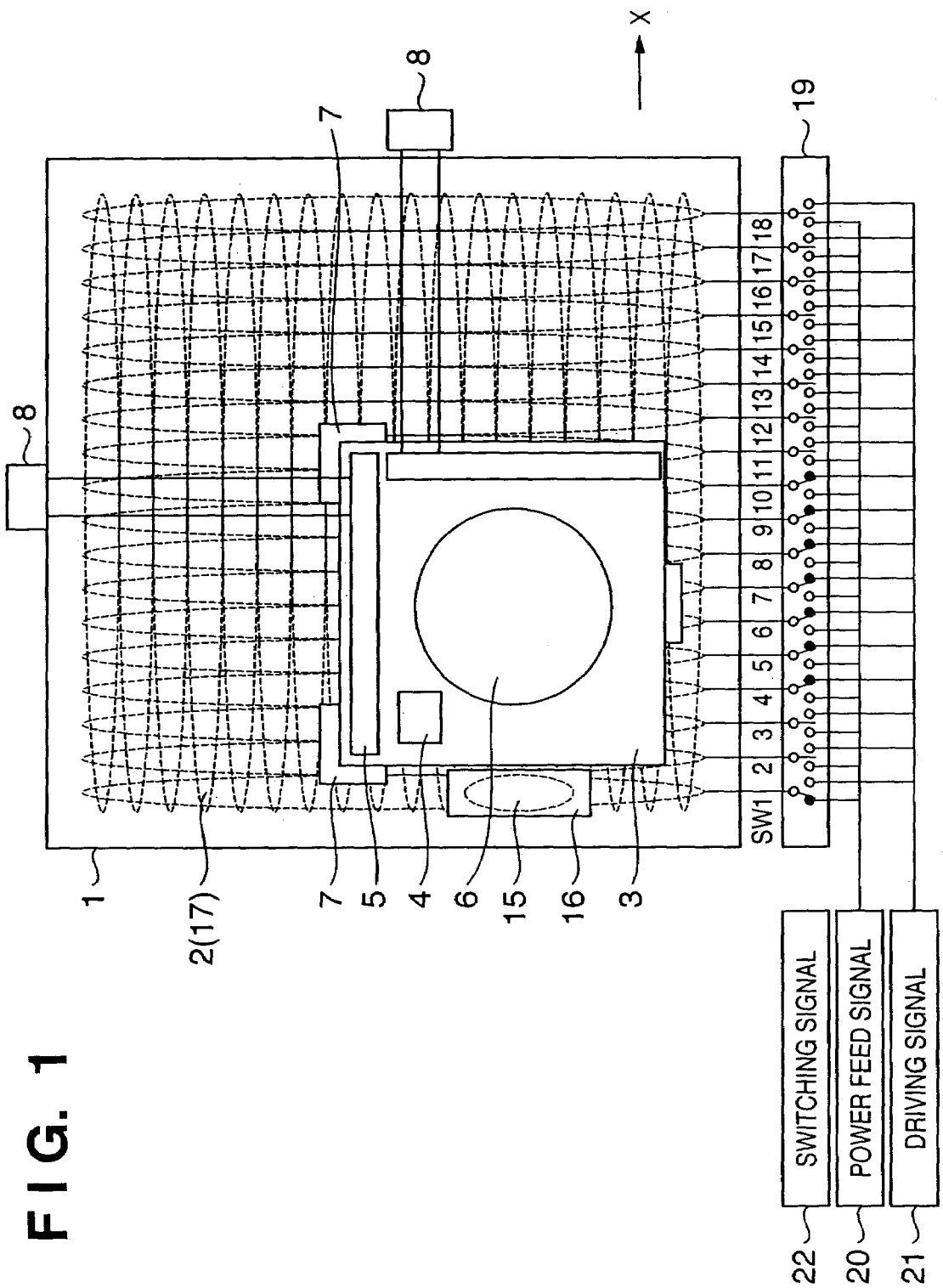
FIG. 1 is a plan view showing the structure of an alignment stage apparatus according to the first embodiment of the present invention.
Figure 2:
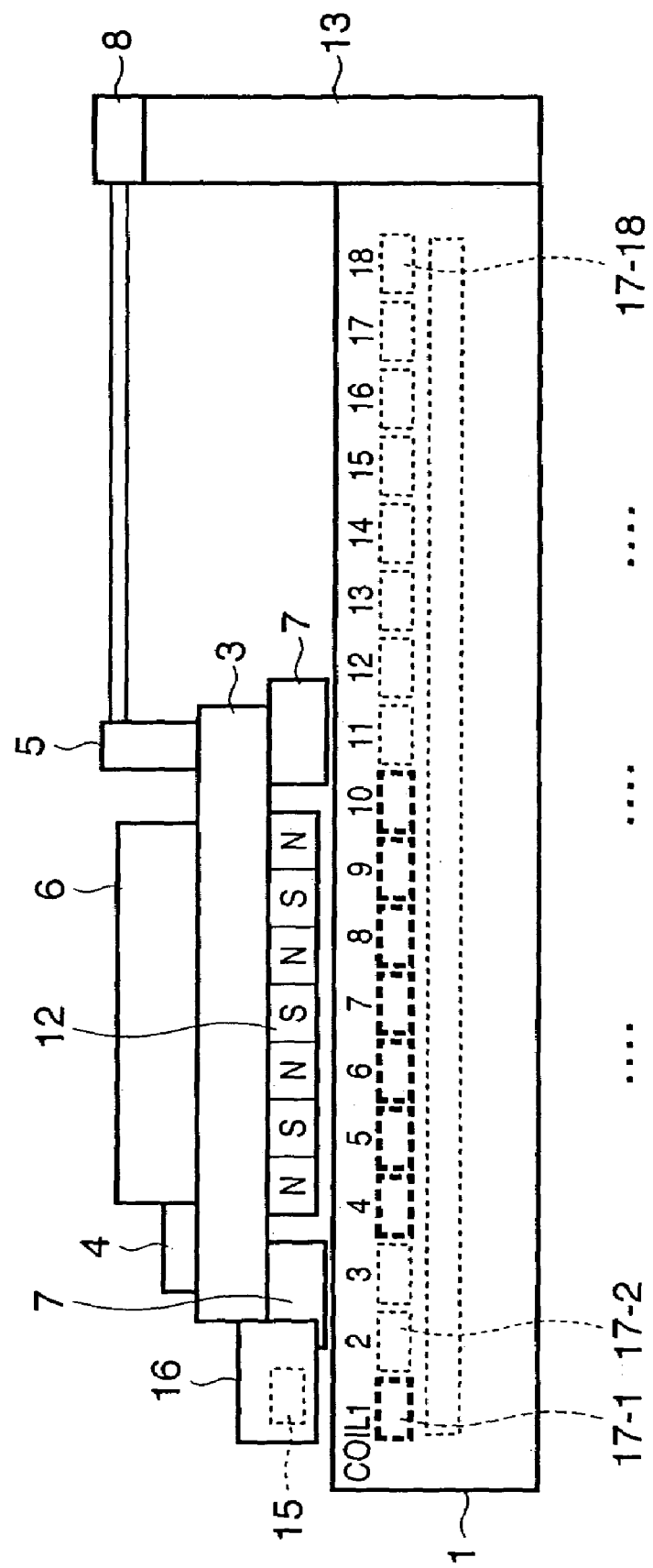
FIG. 2 is a side view of the structure of FIG. 1.

FIG. 1 is a plan view of an alignment stage apparatus according to an embodiment of the present invention, and FIG. 2 is a side view of the same. According to this alignment stage apparatus, a plurality of power transmission coils to supply power are buried in the base structure of an alignment stage having a power reception coil to which an AC magnetic field is to be applied to obtain power in a non-contact manner. The alignment stage apparatus is provided with a means for sequentially switching the power transmission coils in accordance with the position of the stage.

More specifically, in the alignment stage apparatus of FIG. 1, coils 2 are arranged like a matrix in a base structure 1. Permanent magnets 12 are similarly arranged like a matrix under a movable stage main body 3. When a current is supplied to the driving coils 2, the movable stage main body 3 obtains a thrust by the Lorentz force and is driven.

An electrostatic chuck 6, which holds a wafer by the electrostatic force and various types of sensors 4, e.g., a sensor for monitoring the light quantity of a light source and an alignment sensor, are arranged on the movable stage main body 3.

Bearings 7 for supporting the weight of a movable stage including the movable stage main body 3, electrostatic chuck 6, various types of sensors 4, and the like, are arranged on the lower surface of the movable stage main body 3. The movable stage is guided by the bearings 7 in a two-dimensional direction along the surface of the movable stage main body 3 whose flatness is compensated for. Alternatively, the weight of the movable stage can be supported by the Lorentz force. In this case, magnets are arranged on the lower surfaces of the bearings 7 as well.

Two bar mirrors 5 are arranged on the movable stage main body 3 to be perpendicular to each other. A laser interferometer 8 mounted on an interferometer support 13 measures the position of the movable stage. A stage controller (not shown) supplies a current to the driving coils 2 to align the movable stage such that the measurement position coincides with a target value provided by a host control device (not shown). In the stage structure shown in FIG. 1, a plurality of power transmission coils 17 (17-1, 17-2, . . . , and 17-18) are buried in the base structure 1 to be able to feed power constantly at an arbitrary position in a non-contact manner to the electrostatic chuck 6 and various types of sensors 4 on the movable stage main body 3. The power transmission coils 17 can be provided independently of the stage driving coils 2. In this embodiment, the X-direction driving coils 2 also serve to feed power. A power reception coil 15 is supported by a power reception coil support member 16 and arranged on the side surface of the movable stage main body 3.

Switching means 19 for sequentially switching the power transmission coils 17 in accordance with the position of the power reception coil 15, that is, the position of the movable stage main body 3, is connected to the power transmission coils 17. The switching means 19 has switches (SW1 to SW18) for the corresponding power transmission coils 17. A power feed signal 20 and stage driving signal 21 are connected to each switch. The switches SW1 to SW18 are controlled by a switching signal 22 in accordance with the position of the movable stage main body 3.

When the movable stage main body 3 and base structure 1 have the positional relationship as shown in FIG. 2, the power transmission coil 17-1 and power reception coil 15 oppose each other. Thus, the switch SW1 is switched to the power feed signal side, and the coil 17-1 is used as the power transmission coil 17. The coils 17-2 and 17-3 oppose neither the power reception coil 15 nor permanent magnets 12, and can accordingly be used as neither power feed coils nor driving coils. Therefore, the switches SW2 and SW3 are connected to neither the coil 17-2 nor 17-3, but are open.

The coils 17-4 to 17-10 oppose the permanent magnets 12 on the lower surface of the stage main body 3. Thus, the switches SW4 to SW10 are switched to the driving signal side and used as the driving coils 2. The position of the movable stage main body 3 is measured by the laser interferometer 8. When the switching signal is controlled in accordance with the position of the movable stage main body 3, the power transmission coils 17 can be switched between power feeding and driving adequately. In this manner, the power transmission coils 17 arranged in the base structure 1 can also be used as the coils 2 to drive the movable stage main body 3.

Figure 3:
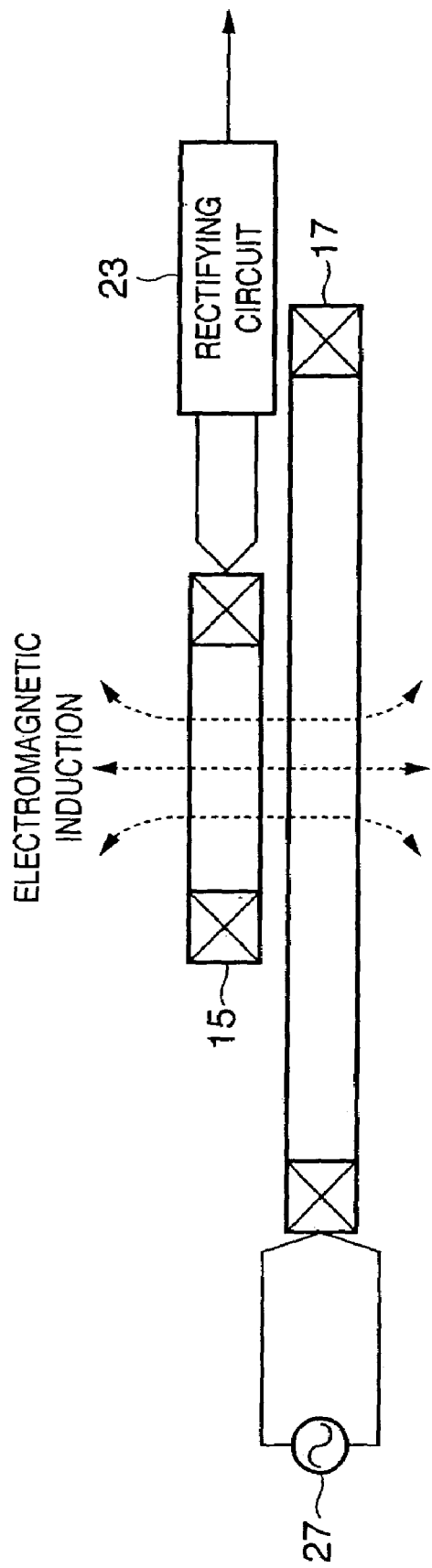
FIG. 3 is a view for explaining power feeding by electromagnetic induction in the structure of FIG. 1.

As shown in FIG. 3, power is transmitted by electromagnetic induction between the power electromagnetic induction between the power transmission coils 17 and power reception coil 15. To transmit the power feed signal, an AC power supply 27 of several kHz to several tens of kHz is used. The power induced in the power reception coil 15 is connected to a load, such as a rectifying circuit 23, and used as a power supply for the electrostatic chuck 6 and sensors 4. If the frequency of the AC power supply 27 is set at a resonance frequency determined by the mutual inductance of the two types of coils, i.e., the power transmission coils 17 and power reception coil 15, and a load (rectifying circuit), power can be transmitted the most efficiently.

Second Embodiment

Figure 4:
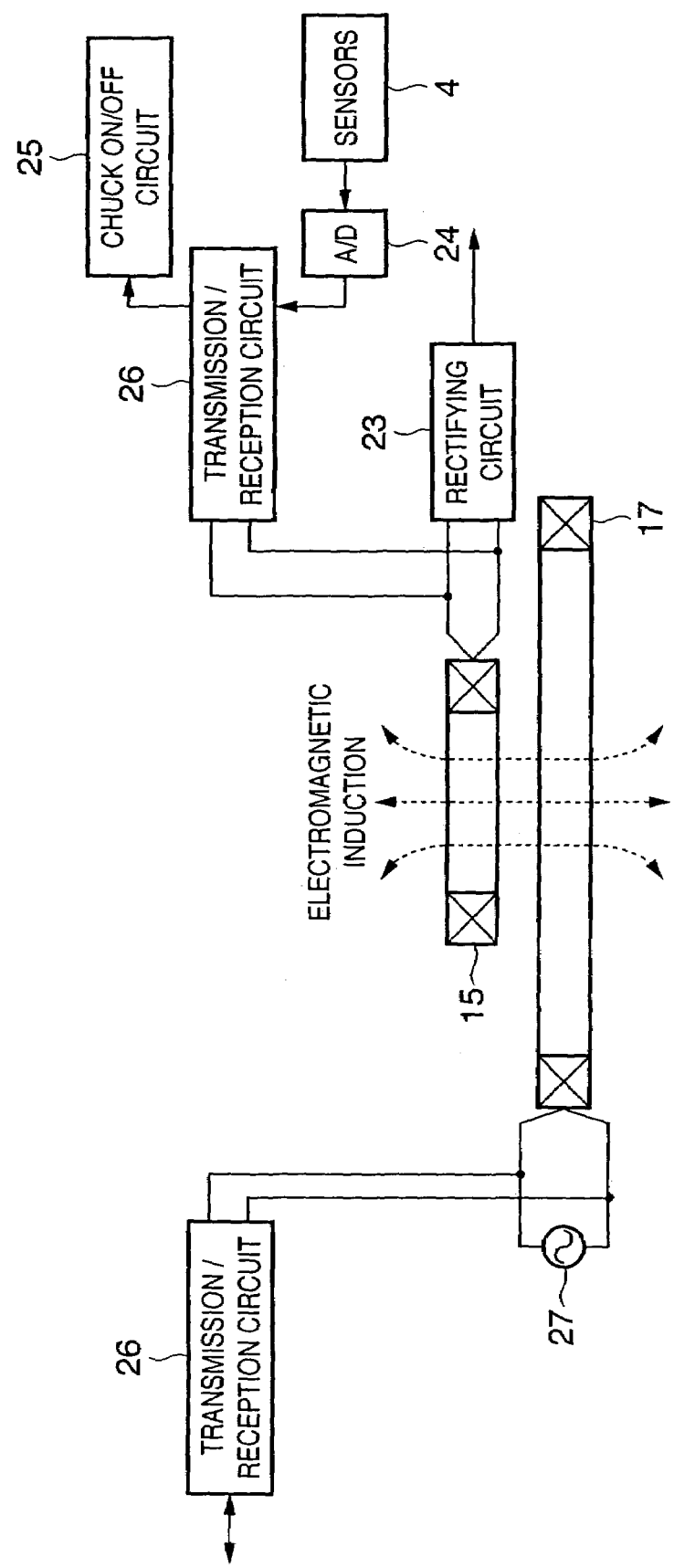
FIG. 4 is a view for explaining signal transmission/reception by electromagnetic induction according to the second embodiment of the present invention.

FIG. 4 shows transmission and reception of a control signal using electromagnetic induction. The electrostatic chuck 6 and sensors 4 are mounted on the movable stage main body 3 of FIGS. 1 and 2. The control device (not shown) provided to the stationary side (base structure side) must also transmit and receive a signal to and from the electrostatic chuck 6 and sensors 4. When exchanging the wafer, voltage application to the electrostatic chuck 6 is disconnected to release a chucked wafer. A chuck on/off circuit 25 is provided for this purpose. An analog signal loaded from the sensors 4 is converted into a digital signal by an A/D (analog-to-digital) converter 24.

If transmission/reception circuits 26 are respectively provided to power transmission coils 17 and a power reception coil 15 and communicate with each other by superposing signals on the coils 17 and 15 to which power is supplied, the control signal can be exchanged by electromagnetic induction. As a power feed signal uses a frequency of several kHz to several tens of kHz, the control signal uses a high-frequency signal of several hundred kHz to several MHz, which does not interfere with the frequency of the power feed signal.

Third Embodiment

Figure 5:
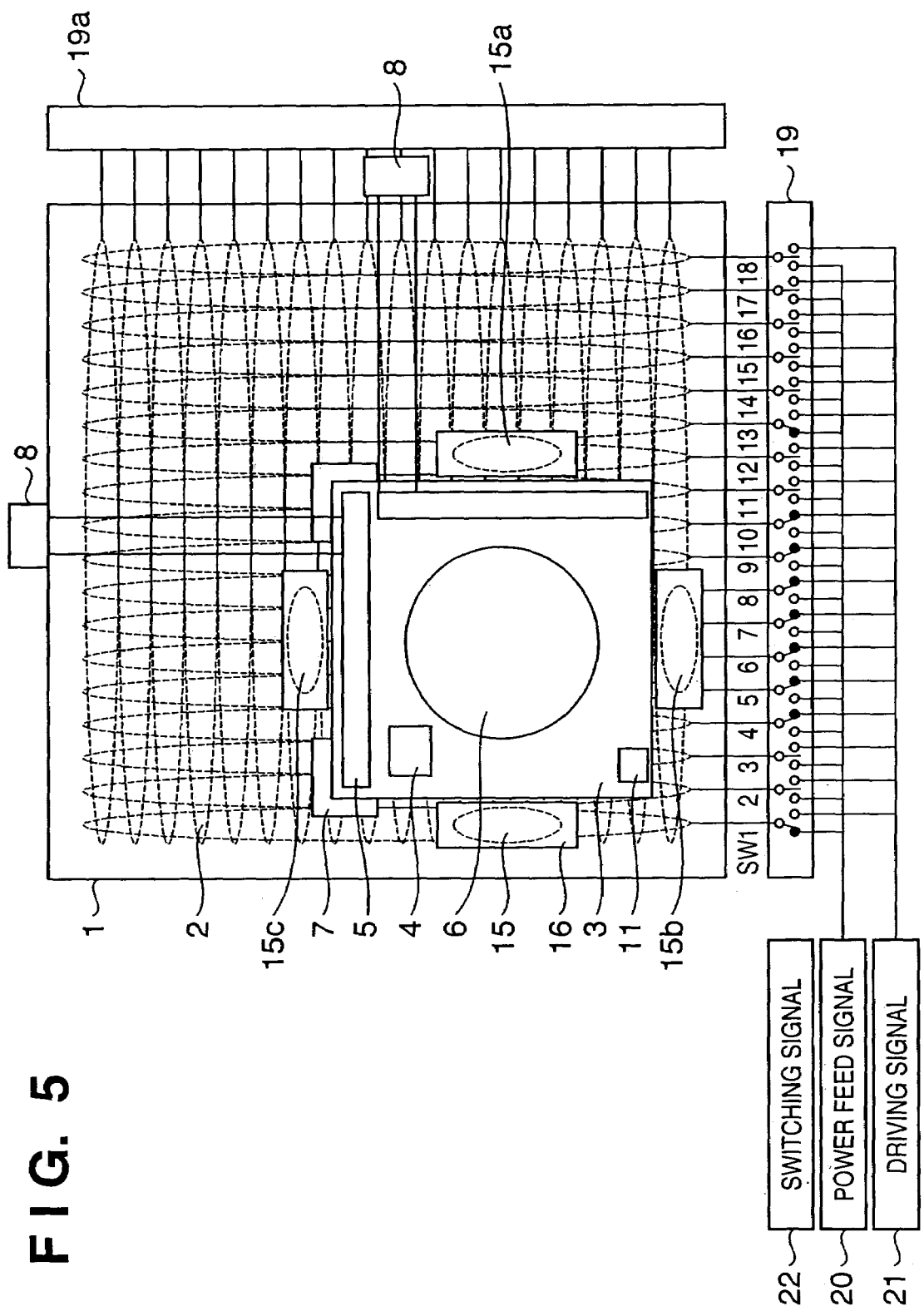
FIG. 5 is a plan view showing the structure of an alignment stage apparatus according to the third embodiment of the present invention.
Figure 6:
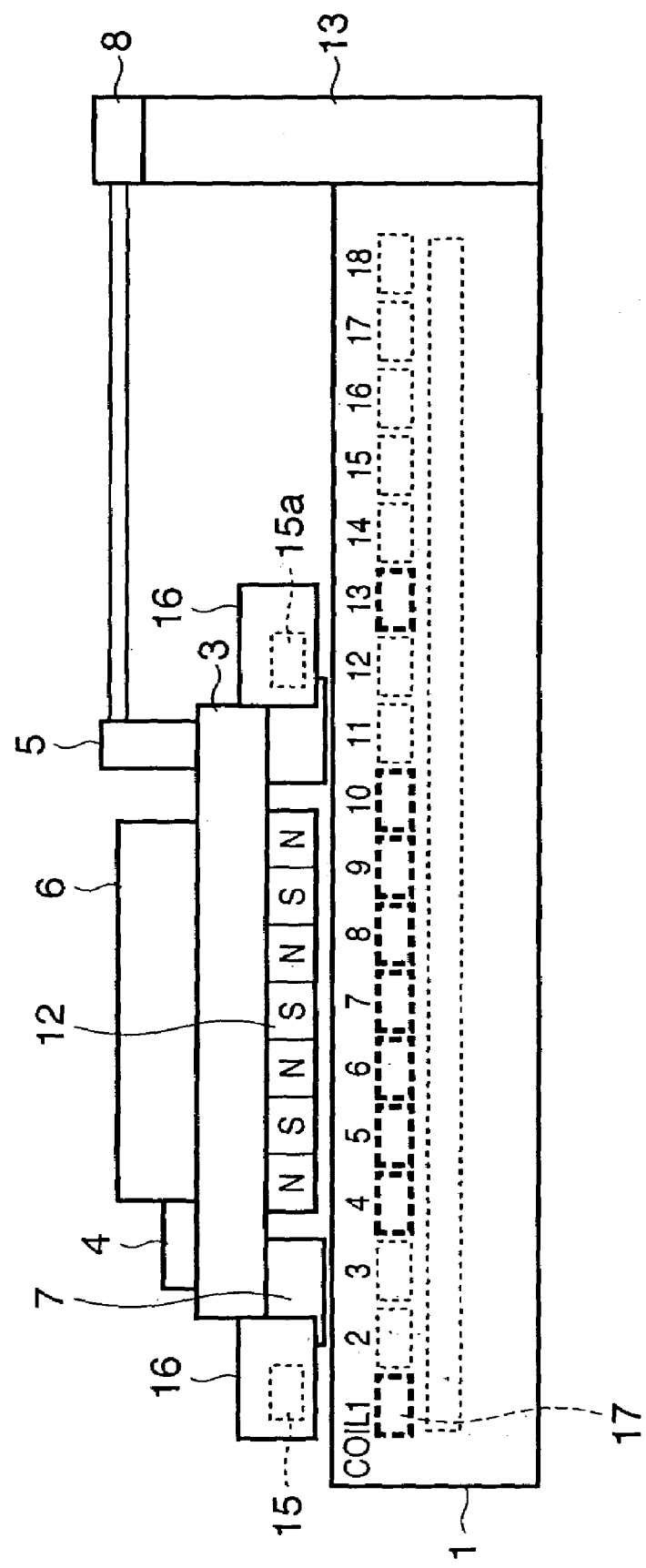
FIG. 6 is a side view of the structure of FIG. 5.

FIG. 5 shows the third embodiment of the present invention. In the first embodiment, only one power reception coil 15 is provided. When the movable stage main body 3 moves, the power reception coil 15 gradually shifts from the position where it opposes the coil 17-1. Accordingly, power transmission efficiency by means of electromagnetic induction decreases.

In order to compensate for this, a power reception coil 15a is added in the second embodiment. The power reception coil 15a is arranged to be phase-shifted from power transmission coils 17. When the two power reception coils, i.e., a power reception coil 15 and the power reception coil 15a, are arranged in the traveling direction of the stage, if the power reception coil 15a is phase-shifted from the power transmission coils 17 by 90°, the fluctuations (ripple) of the total power of the two different-phase coils can be decreased. Similarly, when three power reception coils can be arranged in the traveling direction, if the phases of the coils are shifted from each other by 60°, the fluctuations of the total power of the three different-phase coils can be decreased. In this manner, the power reception coils and power transmission coils are arranged to be phase-shifted from each other by 180°/n where n is the number of power reception coils in the traveling direction of the stage. Regarding the phase, when the power reception coil and power transmission coil oppose each other like the power reception coil 15a and power reception coil 17-1 do in FIG. 5, the phase is 0°. When the power reception coil and power transmission coil are shifted from each other by ½ the pitch of the transmission coils 17, like the power reception coil 15 and power reception coil 17-13 do, the phase is 90°. In other words, the shift of one pitch of the power transmission coils 17 corresponds to a 180°-phase shift. To arrange with a phase shift of 180°/n is to multiply the gap between one power reception coil and an adjacent power reception coil by (K+½n) (where K is an integer of 1 or more) or (K=½n) one pitch of the power transmission coils 17.

When a movable stage main body 3 and base structure 1 have a positional relationship, as shown in FIG. 5, switches SW1 and SW4 to SW10 are switched into the same state as in the first embodiment.

In FIG. 5, as the coil 17-13 is also used as a power transmission coil, a switch SW13 is switched to the power feed signal side by a switching signal. Remaining switches SW2, SW3, SW11, SW12, and SW14 to SW18 are set at the neutral position in the same manner as shown in FIG. 1.

When the movable stage main body 3 moves in the X direction (to the right) in FIG. 5, the coil 17-1 is gradually shifted from the position where it opposes the power reception coil 15, and accordingly, the power transmission efficiency decreases. To the contrary, the coil 17-13 is approaching a position where it opposes the power reception coil 15a, and accordingly, the power transmission efficiency gradually increases on this side. In this manner, when the two power reception coils are arranged to be phase-shifted from each other and the power as the sum of the two coils is fed, power can be supplied constantly, stably, regardless of the position of the movable stage main body 3.

After the movable stage main body 3 further moves in the X direction (to the right) in FIG. 5 so that the power reception coil 15 reaches the intermediate position between the coils 17-1 and 17-2 (to have the same positional relationship as that of the power reception coil 15a and coils 17-12 and 17-13 of FIG. 5), when the movable stage main body 3 is to further move in the X direction (to the right) in FIG. 5, the switch SW1 is switched to the neutral position to disconnect the power reception coil 15 from the power feed signal and the switch SW2 is switched to the power feed signal side so that the coil 17-2 is used as the power transmission coil. The switching timings of the switches SW1 and SW2 can be the same or different. If the switching timings of the switches SW1 and SW2 are shifted to make a time point where both the switches SW1 and SW2 are connected to the power feed signal side simultaneously, power can be fed to the power reception coil 15 through the two power transmission coils 17. This can suppress a decrease in power to be fed, particularly when only one power reception coil 15 is used, as in the first embodiment.

Figure 7:
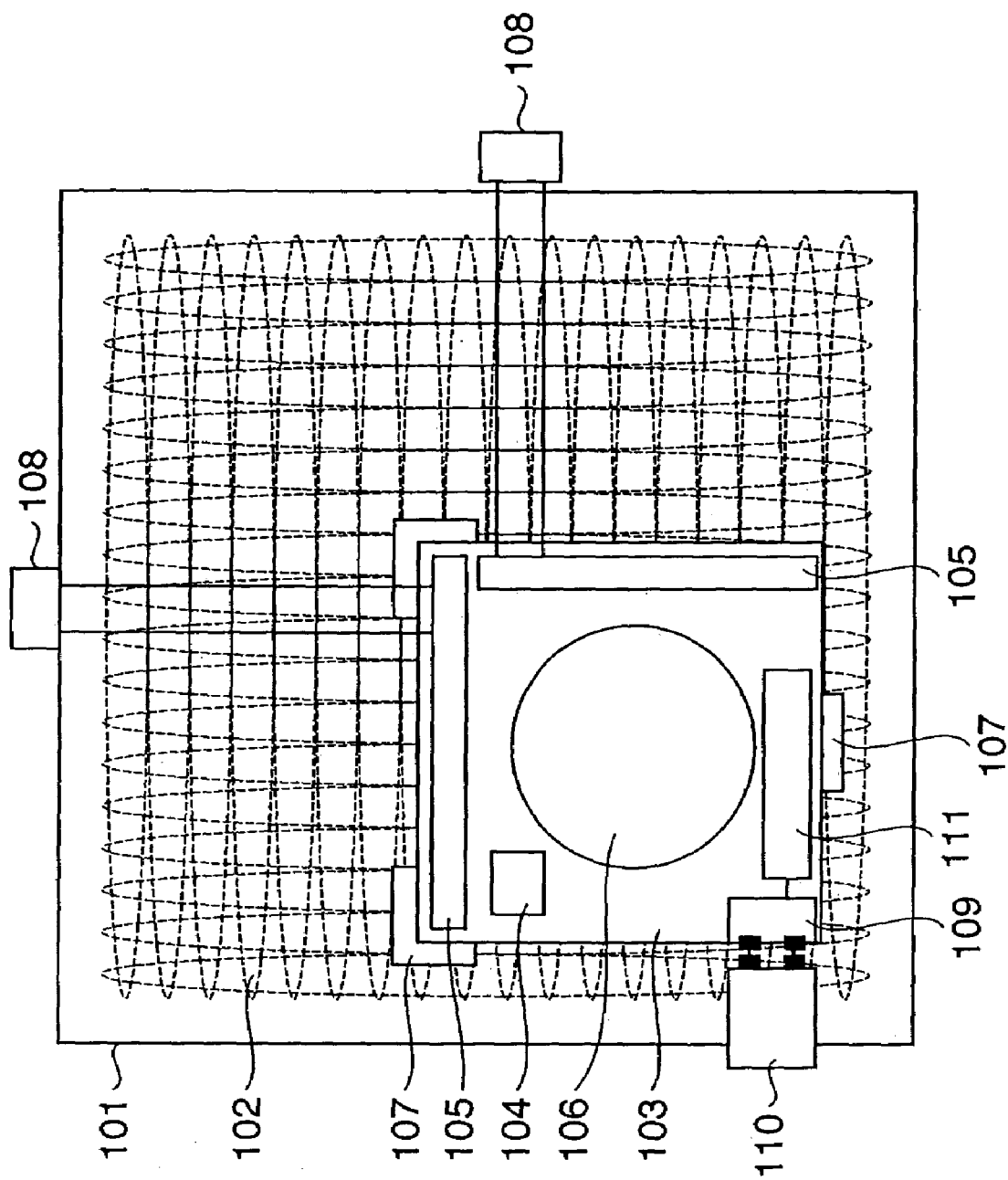
FIG. 7 is a plan view showing the structure of a conventional alignment stage apparatus.
Figure 8:
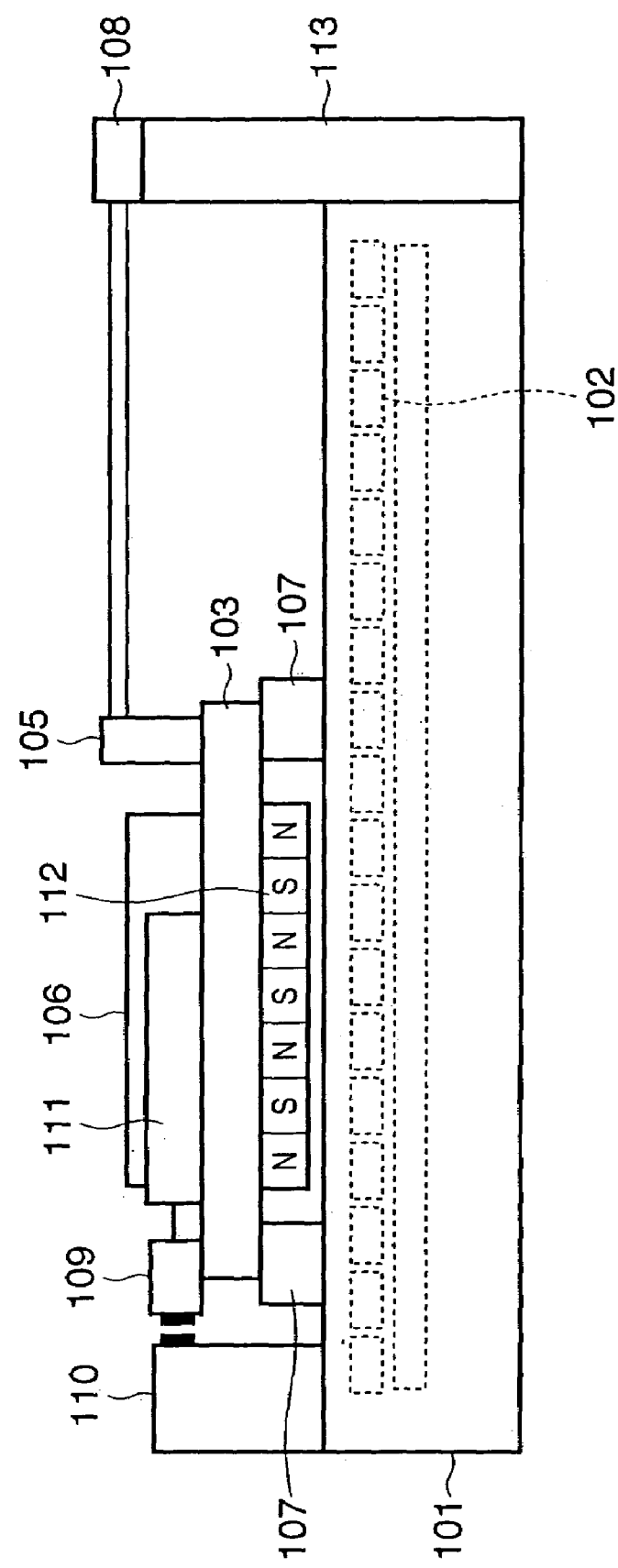
FIG. 8 is a side view of the structure of FIG. 7.
Figure 9:
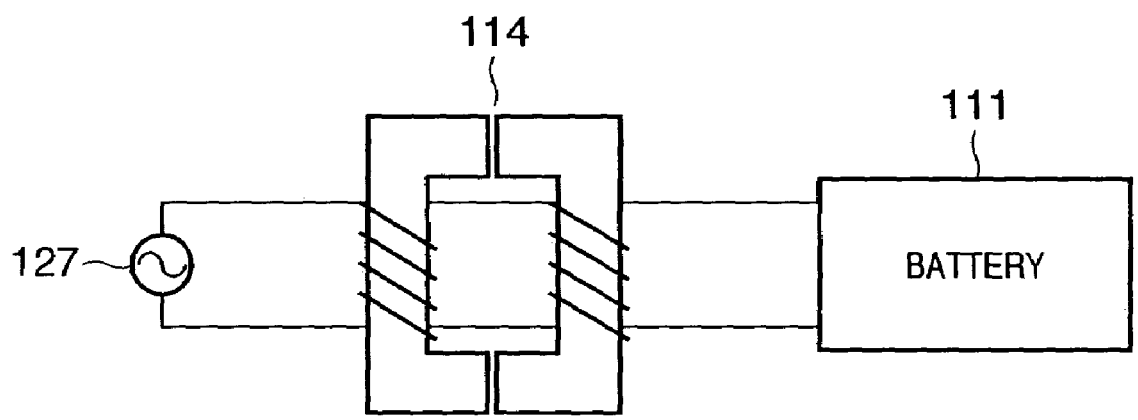
FIG. 9 is a view for explaining power feeding by electromagnetic induction of the conventional example of FIG. 7.

The driving coils may be switched in the same manner as in the prior art of FIGS. 7 and 8.

Fourth Embodiment

In FIG. 5, power reception coils 15b and 15c, and a switching means 19a are arranged in the Y direction as well. When the movable stage is to move in the X direction, power is supplied to a power transmission coil, which opposes the power reception coils 15b and 15c, and is long in the X direction. When the movable stage is to move in the Y direction, power is supplied to a power transmission coil (in the state of FIG. 5, the coil 1 and a coil 12 or 13), which opposes the power reception coils 15 and 15a, and is long in the X direction. Then, the power transmission coils need not be switched, and a switching sequence can be simplified.

The third and fourth embodiments can naturally be combined.

Fifth Embodiment

When a battery 11 is used, as shown in FIG. 5, power can be supplied constantly, stably. In the fifth embodiment, since constant power feeding is possible, no large batteries are needed, and a compact, lightweight battery can be employed.

When a battery is to be mounted on a movable stage, power, which has been fed, may be stored once in the battery and then fed from the battery to the respective portions in the movable stage. Then, due to fluctuations in power consumption in the movable stage or a decrease in power transmission efficiency as a result of the positional relationship between the power reception coil 15 and power transmission coils 17, if the power consumption in the moveable stage exceeds the power feed, power can be supplied to the respective portions in the movable stage stably. Power is fed to the movable stage at an arbitrary position or timing. Even during a process such as exposure, the battery is charged at a position or timing when the power feed exceeds the power consumption. The necessity to move the movable stage to a specific position for the purpose of charging, to delay the start of a process, such as exposure, or to interrupt the process, is very small. The battery is constantly capable of being floating-charged and accordingly, requires no extra time for charging.

To employ the battery 11, as well, is particularly effective when only one power reception is provided, as in the embodiment shown in FIG. 1.

As described above, according to the above embodiments, a large battery need not be mounted on the movable stage and the stage can accordingly be made lightweight. Therefore, the speed of the movable stage can be increased, so that a high throughput can be achieved. Since power can be fed in a complete non-contact manner, power feed through an electrical cable is not necessary. The alignment accuracy will not accordingly be degraded by a cable packaging disturbance, or the like. Since no cable is used, trouble, such as dust being produced when the cable is rubbed to attach to the wafer, insufficient insulation or wire disconnection due to the degrading of the jacket of the cable, and the like, are eliminated. The above embodiments are particularly suitable to a stage apparatus having a flat structure.

Sixth Embodiment

Figure 10:
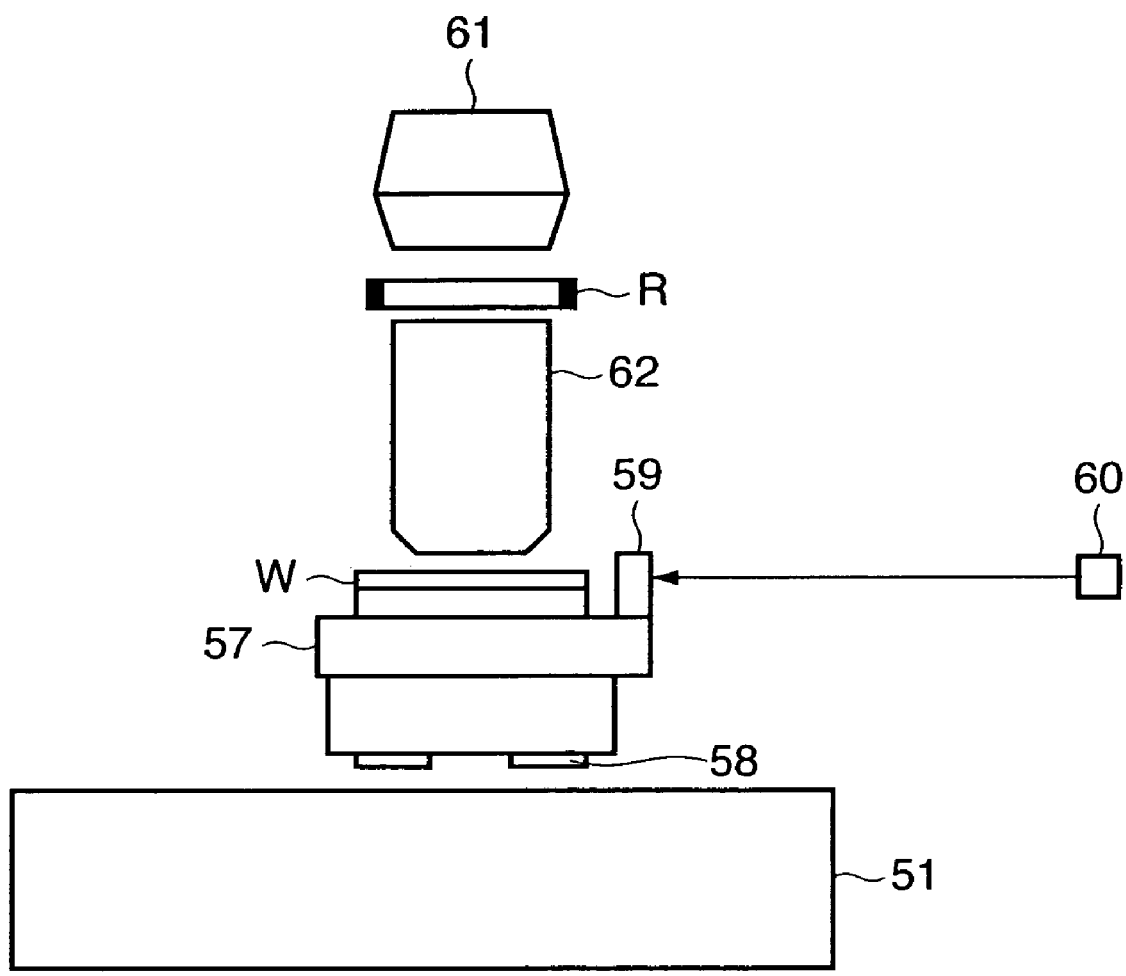
FIG. 10 is a front view showing a structure of an exposure apparatus which uses an alignment stage apparatus of the present invention.

FIG. 10 shows a semiconductor device manufacturing exposure apparatus, which uses the alignment stage apparatus described above as a wafer stage.

This exposure apparatus is used for the manufacture of a device having a fine pattern such as semiconductor device, e.g., a semiconductor integrated circuit, a micromachine, a thin film magnetic head, or the like. Exposure light (this term is a generic term for visible light, ultraviolet light, EUV light, X-rays, an electron beam, a charged particle beam, and the like) as exposure energy from a light source 61 through a reticle R, as a master, irradiates a semiconductor wafer W as a substrate via a projection lens (this term is a generic term for a refracting lens, a reflecting lens, a catadioptric lens system, a charged particle lens, and the like) 62 as a projection system, to form a desired pattern on the substrate.

In this exposure apparatus, a surface plate 51 has a multi-phase electromagnetic coil (the coils 17 of FIG. 2), and a moving stage 57 has permanent magnets (the permanent magnets 12 of FIG. 2) group.

The moving stage 57 (the movable stage 3 of FIG. 2) is supported by hydrostatic bearings 58 (the hydrostatic bearings 7 of FIG. 2). The movement of the moving stage 57 is measured by using a mirror 59 (the bar mirrors 5 of FIG. 2) fixed to the moving stage 57, and an interferometer 60 (the laser interferometer 8 of FIG. 2).

The wafer W as the substrate is held on a chuck (the electrostatic chuck 6 of FIG. 2) mounted on the moving stage 57. The pattern of the reticle R as the master is reduced and transferred onto the respective regions on the photoresist-coated wafer W by the light source 61 and projection lens 62 by the step and repeat scheme or step and scan scheme to form a latent image pattern on the photoresist.

The alignment stage apparatus of the present invention can similarly be applied to an exposure apparatus that forms a latent image pattern on a photoresist without using a mask, but by drawing a circuit pattern directly on a semiconductor wafer.

Figure 11:
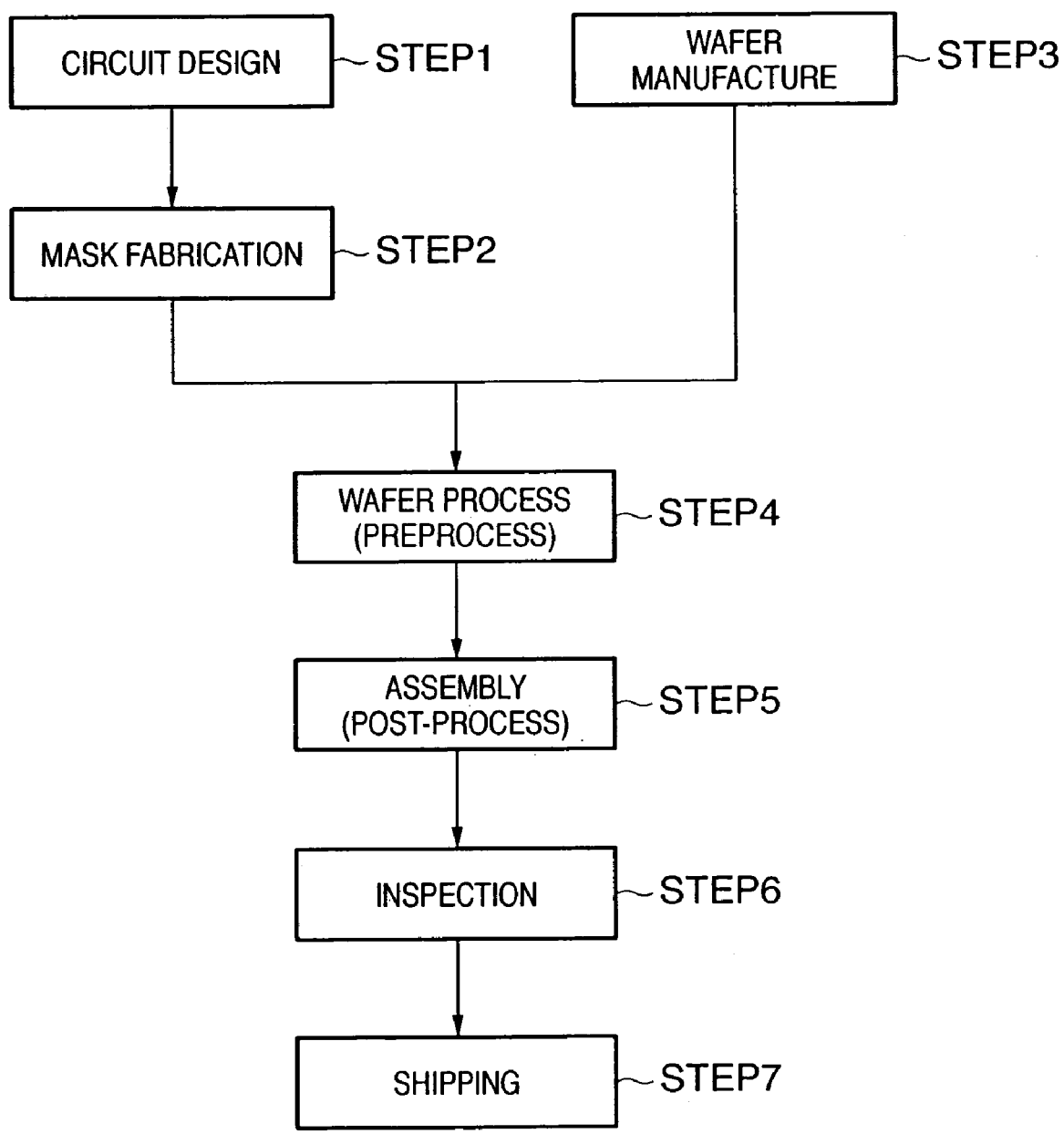
FIG. 11 is a flowchart for explaining the flow of a device manufacturing process which uses the exposure apparatus of FIG. 10.

A semiconductor device manufacturing process using this exposure apparatus will be described. FIG. 11 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern.

In step 3 (wafer manufacture), a wafer is manufactured using a material such as silicon. In step 4 (wafer process), called a preprocess, an actual circuit is formed on the wafer by the above exposure apparatus in accordance with lithography. In the next step, step 5 (assembly), called a postprocess, a semiconductor chip is formed from the wafer fabricated in step 5. This step includes processes such as assembly (dicing and bonding) and packaging (chip encapsulation). In step 6 (inspection), inspections including an operation check test and a durability test of the semiconductor device fabricated in step 5 are performed. A semiconductor device is finished with these steps and delivered.

The wafer process of step 4 includes the following steps, i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of etching portions other than the resist image developed in the developing stage, and a resist removal step of removing any unnecessary resist after etching. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-016857 filed Jan. 26, 2004, the entire contents of which are hereby incorporated by reference herein.

What is claimed is:

1. An alignment stage apparatus including a base structure and a movable stage which can move along a surface of the base structure so as not to be in contact with the base structure, said apparatus comprising:
   a plurality of power transmission coils buried under the surface of the base structure;
   a power reception coil attached to the movable stage to oppose the surface;
   a switch unit configured to sequentially switch, of said plurality of power transmission coils, those that are to be energized to feed power in accordance with a position of the movable stage; and
   a power feed unit configured to supply AC power to said power transmission coils to be energized through said switch unit,
   wherein said power reception coil comprises a plurality of power reception coils arrayed in a driving direction of said movable stage, and said power reception coils and power transmission coils are phase-shifted from each other by $180°/n$ where n is the number of power reception coils arrayed in the driving direction of said movable stage.

2. An alignment stage apparatus including a base structure and a movable stage which can move along a surface of the base structure so as not to be in contact with the base structure, said apparatus comprising:
   a plurality of power transmission coils buried under the surface of the base structure;
   a power reception coil attached to the movable stage to oppose the surface;
   a switch unit configured to sequentially switch, of said plurality of power transmission coils, those that are to be energized to feed power in accordance with a position of the movable stage; and
   a power feeding unit configured to supply AC power to said power transmission coils to be energized through said switch unit,
   wherein a frequency of the AC power is set at a resonance frequency determined by a load and a mutual inductance of said power transmission coils and said power reception coil.

* * * * *

UNITED STATES PATENT AND TRADEMARK OFFICE
CERTIFICATE OF CORRECTION

PATENT NO. : 7,084,534 B2 Page 1 of 1
APPLICATION NO. : 11/030952
DATED : August 1, 2006
INVENTOR(S) : Shinji Ohishi et al.

It is certified that error appears in the above-identified patent and that said Letters Patent is hereby corrected as shown below:

COLUMN 2:
   Line 31, "throughout" should read -- throughput --.
   Line 37, "No. 8-81137," should read -- No. 8-51137, --.

COLUMN 6:
   Line 62, "second" should read -- third --.

COLUMN 7:
   Line 13, the second occurrence of "reception" should read -- transmission --.
   Line 17, "reception" should read -- transmission --.

COLUMN 8:
   Line 44, "reception" should read -- reception coil --.

COLUMN 10:
   Line 53, "feeding" should read -- feed --.

Signed and Sealed this

Sixteenth Day of January, 2007

JON W. DUDAS
*Director of the United States Patent and Trademark Office*